United States Patent
Hung et al.

(10) Patent No.: US 9,698,019 B2
(45) Date of Patent: Jul. 4, 2017

(54) N-WORK FUNCTION METAL WITH CRYSTAL STRUCTURE

(71) Applicant: Taiwan Semiconductor Manufacturing Company, Ltd., Hsin-Chu (TW)

(72) Inventors: Chi-Cheng Hung, Tainan (TW); Kuan-Ting Liu, Hsin-Chu (TW); Jun-Nan Nian, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 228 days.

(21) Appl. No.: 14/213,194

(22) Filed: Mar. 14, 2014

(65) Prior Publication Data
US 2015/0262822 A1 Sep. 17, 2015

(51) Int. Cl.
| | |
|---|---|
| *H01L 21/28* | (2006.01) |
| *H01L 29/49* | (2006.01) |
| *H01L 29/66* | (2006.01) |
| *H01L 29/78* | (2006.01) |
| *H01L 29/165* | (2006.01) |

(52) U.S. Cl.
CPC ...... *H01L 21/28088* (2013.01); *H01L 29/165* (2013.01); *H01L 29/4966* (2013.01); *H01L 29/66545* (2013.01); *H01L 29/66636* (2013.01); *H01L 29/7834* (2013.01); *H01L 29/6656* (2013.01)

(58) Field of Classification Search
CPC ............... H01L 21/28026; H01L 29/49; H01L 29/66545; H01L 29/4966
See application file for complete search history.

(56) References Cited

U.S. PATENT DOCUMENTS

| | | | | |
|---|---|---|---|---|
| 5,067,988 A | * | 11/1991 | Froes | C22F 1/02 148/513 |
| 5,869,901 A | * | 2/1999 | Kusuyama | H01L 21/32051 257/763 |
| 2003/0183877 A1 | * | 10/2003 | Yagishita | H01L 27/1203 257/347 |
| 2003/0183901 A1 | * | 10/2003 | Kanda | H01L 21/2807 257/510 |
| 2006/0022277 A1 | * | 2/2006 | Kavalieros | H01L 21/28079 257/369 |
| 2011/0189847 A1 | * | 8/2011 | Tsai | H01L 21/28 438/595 |

(Continued)

FOREIGN PATENT DOCUMENTS

| | | |
|---|---|---|
| TW | 201332107 A | 8/2013 |
| TW | 201403829 A | 1/2014 |

*Primary Examiner* — Amar Movva
(74) *Attorney, Agent, or Firm* — Slater Matsil, LLP

(57) ABSTRACT

A method includes forming a dummy gate stack over a semiconductor substrate, wherein the semiconductor substrate is comprised in a wafer. The method further includes removing the dummy gate stack to form a recess, forming a gate dielectric layer in the recess, and forming a metal layer in the recess and over the gate dielectric layer. The metal layer has an n-work function. A portion of the metal layer has a crystalline structure. The method further includes filling a remaining portion of the recess with metallic materials, wherein the metallic materials are overlying the metal layer.

20 Claims, 6 Drawing Sheets

(56) References Cited

U.S. PATENT DOCUMENTS

| | | | |
|---|---|---|---|
| 2012/0222732 A1* | 9/2012 | Choi | H01L 33/007 |
| | | | 136/255 |
| 2012/0306026 A1* | 12/2012 | Guo | H01L 29/495 |
| | | | 257/407 |
| 2013/0224927 A1* | 8/2013 | Schmidbauer | H01L 21/28088 |
| | | | 438/299 |
| 2013/0299914 A1* | 11/2013 | Kim | H01L 27/092 |
| | | | 257/369 |
| 2013/0299918 A1* | 11/2013 | Kim | H01L 29/78 |
| | | | 257/402 |
| 2014/0001543 A1* | 1/2014 | Kim | H01L 29/66636 |
| | | | 257/330 |
| 2014/0015037 A1 | 1/2014 | Ng et al. | |
| 2014/0054654 A1* | 2/2014 | Hsieh | H01L 29/78 |
| | | | 257/288 |
| 2015/0061041 A1* | 3/2015 | Lin | H01L 21/28088 |
| | | | 257/410 |
| 2015/0155365 A1* | 6/2015 | Lee | H01L 29/4966 |
| | | | 257/412 |
| 2015/0206963 A1* | 7/2015 | Ho | H01L 21/31111 |
| | | | 257/411 |
| 2015/0262823 A1* | 9/2015 | Hung | H01L 21/2855 |
| | | | 257/368 |
| 2015/0279838 A1* | 10/2015 | Tsao | H01L 29/66545 |
| | | | 257/383 |

* cited by examiner

N-WORK FUNCTION METAL WITH CRYSTAL STRUCTURE

BACKGROUND

Metal-Oxide-Semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
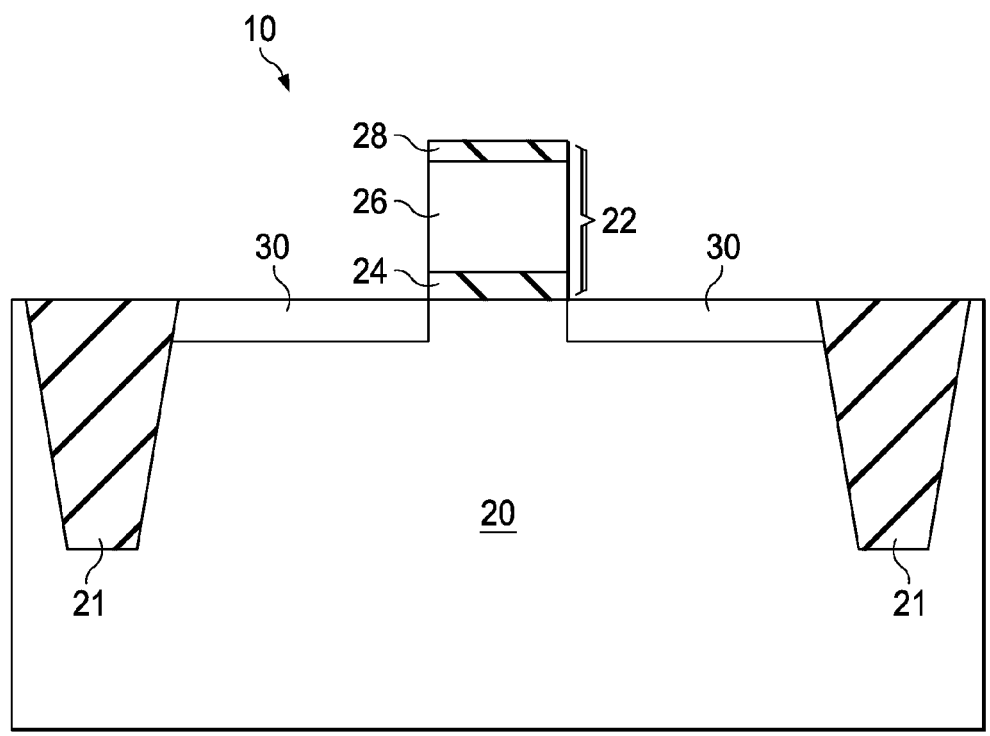
FIGS. 1 through 10 illustrate the cross-sectional views of intermediate stages in the formation of a Metal-Oxide-Semiconductor (MOS) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Metal-Oxide-Semiconductor (MOS) device and the method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

FIGS. 1 through 10 are cross-sectional views of intermediate stages in the formation of a MOS device in accordance with some exemplary embodiments. Referring to FIG. 1, wafer 10, which comprises substrate 20, is provided. Substrate 20 may be formed of a semiconductor material such as silicon, silicon carbon (SiC), silicon germanium (SiGe), a III-V compound semiconductor, or the like. Shallow Trench Isolation (STI) regions 21 are formed in substrate 20, and are used to define the active regions of MOS devices.

Dummy gate stack 22 is formed over substrate 20. Dummy gate stack 22 includes dummy gate dielectric 24 and dummy gate electrode 26. Dummy gate dielectric 24 includes silicon oxide in some exemplary embodiments. In alternative embodiments, other materials such as silicon nitride, silicon carbide, or the like, are also used. Dummy gate electrode 26 may include polysilicon. In some embodiments, dummy gate stacks 22 further includes hard mask 28 over dummy gate electrode 26. Hard mask 28 may comprise silicon nitride, for example, while other materials such as silicon carbide, silicon oxynitride, and the like may also be used. In alternative embodiments, hard mask 28 is not formed.

Figure 10:
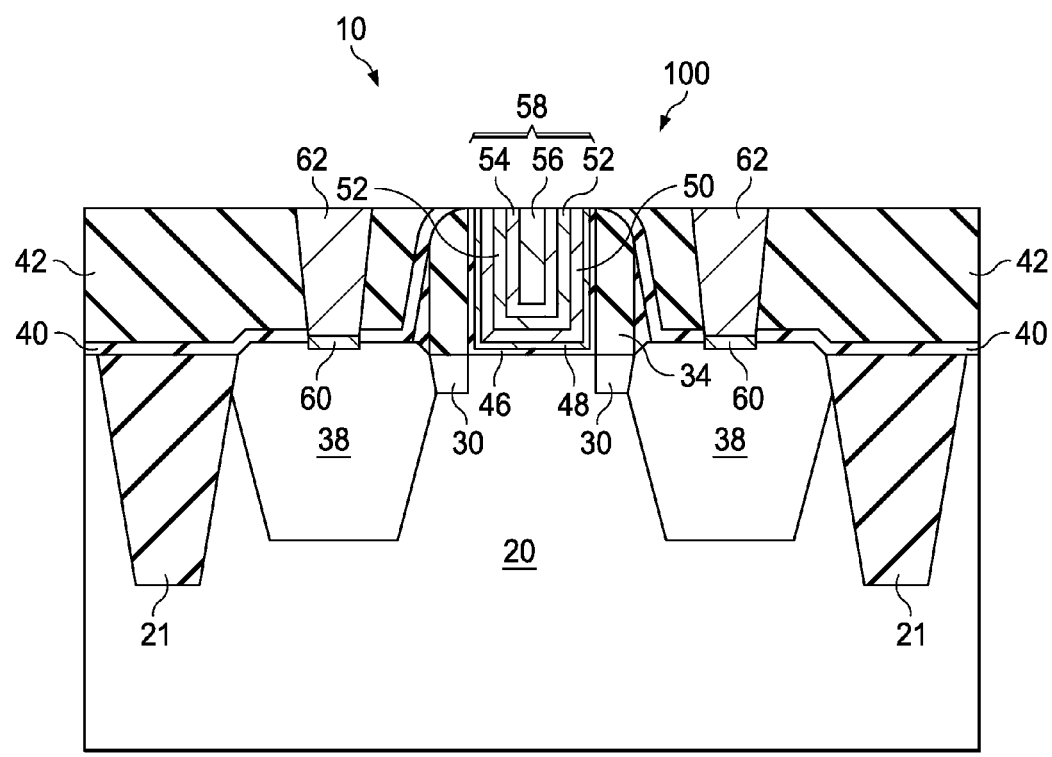

Lightly-Doped Drain/source (LDD) regions 30 are formed, for example, by implanting a p-type impurity (such as boron and/or indium) or an n-type impurity (such as phosphorous and/or arsenic) into substrate 20, depending on the conductivity type of the resulting MOS device 100 (FIG. 10). For example, when MOS device 100 is a pMOS device, LDD regions 30 are p-type regions. When the MOS device 100 is an nMOS device, LDD regions 30 are n-type regions. Dummy gate stacks 22 acts as an implantation mask, so that the edges of LDD regions 30 are substantially aligned with the edges of gate stacks 22.

Figure 2:
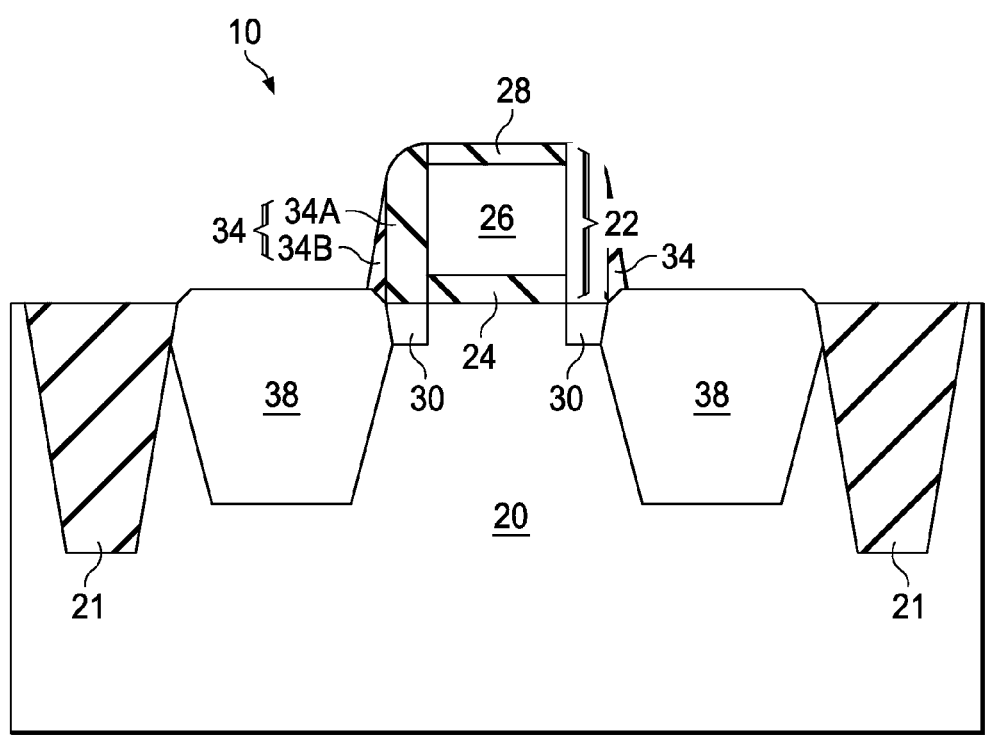

Referring to FIG. 2, gate spacers 34 are formed on the sidewalls of dummy gate stack 22. In some embodiments, each of gate spacers 34 includes silicon oxynitride layer 34A and silicon oxide layer 34B. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LP-CVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 10) is a pMOS device, source/drain regions 38 are of p-type. In the embodiments wherein MOS device 100 is an nMOS device, source/drain regions 38 are of n-type. In some embodiments, source/drain stressors (also marked as 38) are formed in semiconductor substrate 20. The source/drain stressors form at least parts of source and drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 10) is an nMOS device, source/drain stressors 38 may comprise silicon phosphorous (SiP), silicon carbon (SiC), or the like. In the embodiments in which MOS device 100 is a pMOS device, source/drain stressors 38 may comprise silicon germanium (SiGe). The formation of source/drain stressors 38 may be achieved by etching semiconductor substrate 20 to form recesses therein, and then performing an epitaxy to grow source/drain stressors 38 in the recesses.

Figure 3:
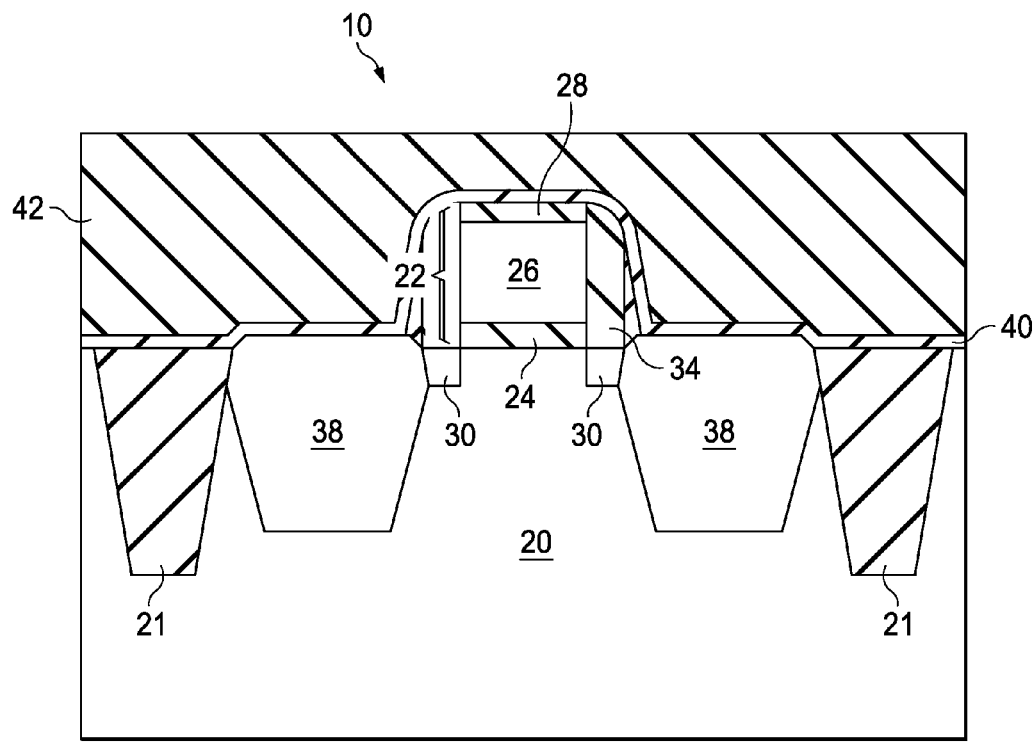

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a height higher than the top surface of dummy gate stack 22. ILD 42 may comprise flowable oxide formed using, for example, Flowable Chemical Vapor Deposition (FCVD). ILD 42 may also be a spin-on glass formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
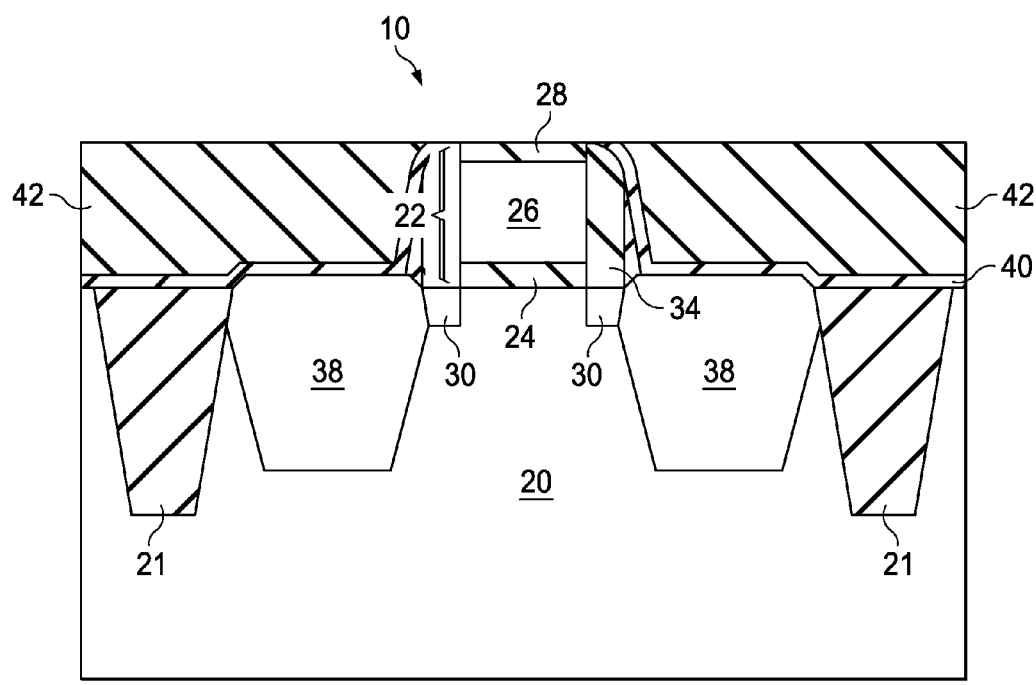

FIG. 4 illustrates a planarization step, which is performed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
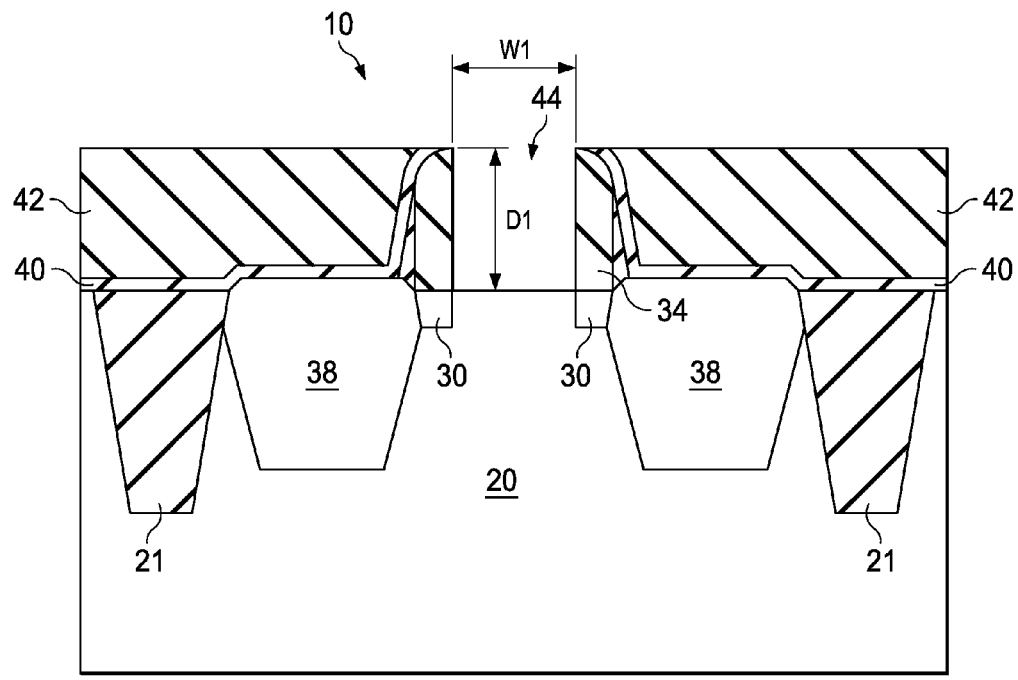

Next, dummy gate stack 22 is removed. Recess 44 is formed as a result of the removal of dummy gate stack 22, wherein the resulting structure is shown in FIG. 5. In some embodiment, the width W1 of recess 44 is smaller than about 25 nm, and may be in the range between about 18 nm and about 22 nm. It is appreciated, however, that the values recited throughout the description are merely examples, and may be changed to different values. Furthermore, depth D1 of recess 44 may be greater than about 40 nm. The aspect ratio D1/W1 of recess 44 may be higher than about 1.3, and may be higher than about 7.0, or higher than about 10. Such high aspect ratio, small width W1, and great depth D1 demand the subsequently formed metal layers to be conformal in order to achieve the required performance.

Figure 6:
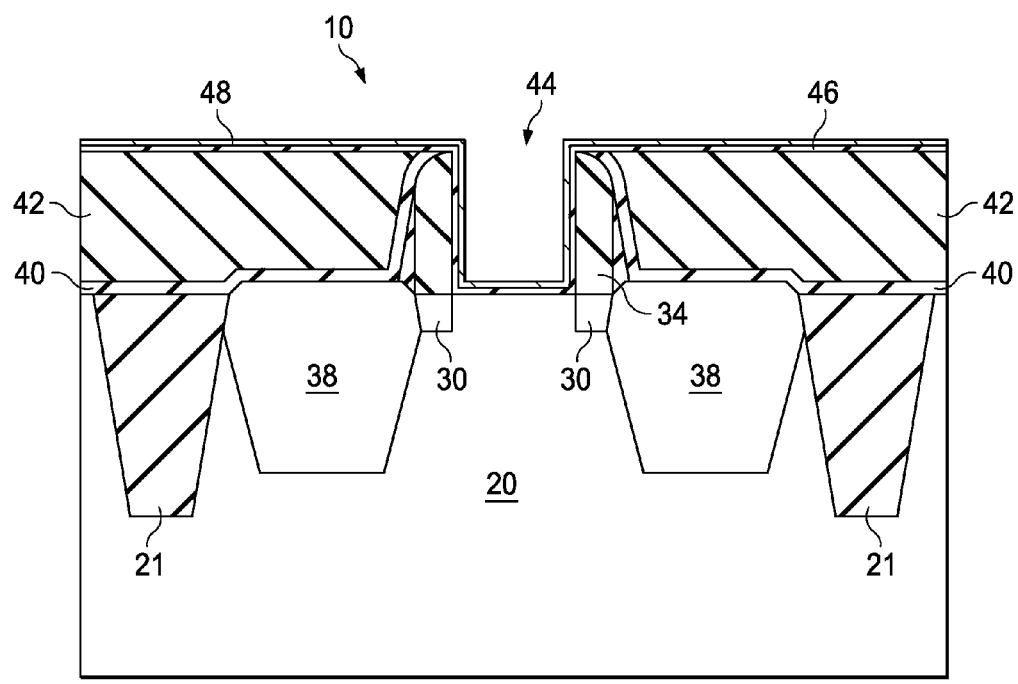

FIGS. 6 through 9 illustrate the formation of a replacement gate stack. Referring to FIG. 6, gate dielectric layer 46 is formed. In some embodiments, gate dielectric layer 46 includes an Interfacial Layer (IL, the lower part of gate dielectric layer 46), which is a dielectric layer. In some embodiments, the IL layer includes an oxide layer such as a silicon oxide layer, which may be formed through the thermal oxidation of substrate 20, a chemical oxidation, or a deposition step. Gate dielectric layer 46 may also include a high-k dielectric layer (the upper part of gate dielectric layer 46) comprising a high-k dielectric material such as hafnium oxide, lanthanum oxide, aluminum oxide, or the like. The dielectric constant (k-value) of the high-k dielectric material is higher than 3.9, and may be higher than about 7.0, and sometimes as high as 21.0 or higher. The high-k dielectric layer is overlying, and may contact, the interfacial dielectric.

As shown in FIG. 6, diffusion barrier layer 48 is formed over gate dielectric layer 46. In some embodiments, diffusion barrier layer 48 includes TiN, TaN, or composite layers thereof. For example, diffusion barrier layer 48 may include a TiN layer (the lower part of diffusion barrier layer 48), and a TaN layer (the upper part of diffusion barrier layer 48) over the TiN layer. The TiN layer may have a thickness lower than about 65 Å, and the TaN layer may have a thickness lower than about 20 Å.

Figure 7:
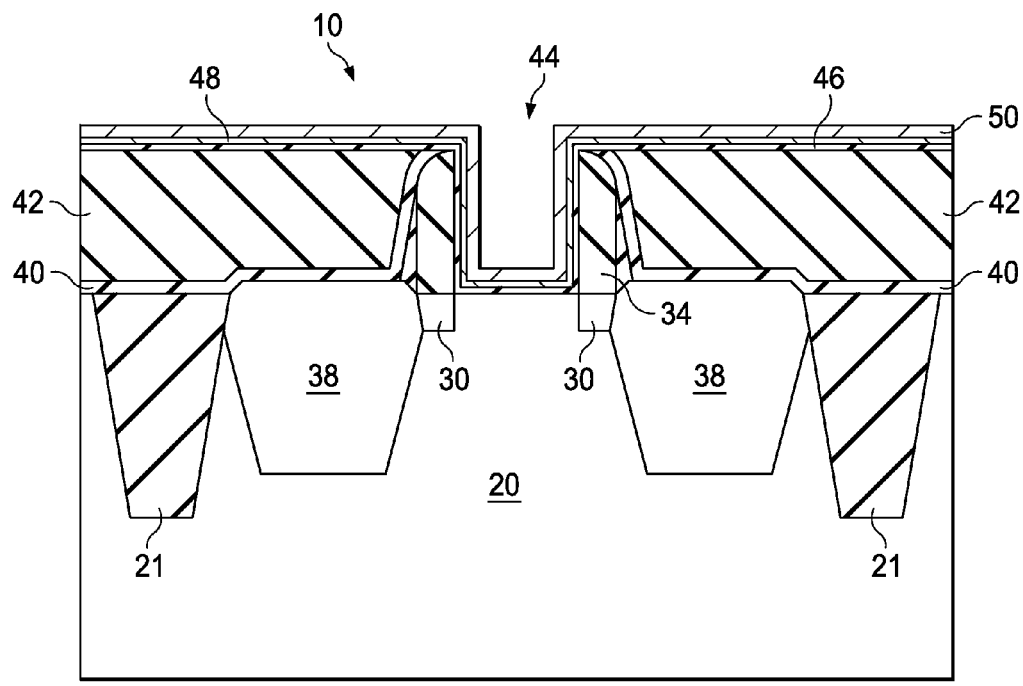

Referring to FIG. 7, metal layer 50 is formed. Metal layer 50 may comprise titanium aluminum (TiAl) in accordance with some embodiments. In the embodiments in which the resulting MOS device 100 (FIG. 10) is an N-type MOS (NMOS) device, metal layer 50 is in contact with diffusion barrier layer 48. For example, in the embodiments in which diffusion barrier layer 48 comprises a TiN layer and a TaN layer, metal layer 50 may be in physical contact with the TaN layer. In alternative embodiments in which the resulting MOS device 100 (FIG. 10) is a P-type MOS (PMOS) device, an additional TiN layer (not shown) is formed between, and in contact with, the TaN layer (in diffusion barrier layer 48) and the overlaying metal layer 50. The additional TiN layer provides the work function suitable for PMOS devices, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

Metal layer 50 provides the work function suitable for NMOS devices, which work function is lower than the mid-gap work function. The work function lower than the mid-gap work function is referred to as an n-work function, and the respective metal having the n-work function may be referred to as an n-metal. In some embodiments, metal layer 50 is an n-metal having a work function lower than about 4.3 eV. The work function of metal layer 50 may also be in the range between about 3.8 eV and about 4.6 eV.

The formation of metal layer 50 may be achieved through Physical Vapor Deposition (PVD). In accordance with some embodiments of the present disclosure, metal layer 50 is formed at a temperature higher than the room temperature (for example, about 20° C. to about 25° C.). The temperature is selected, so that metal layer 50 has a substantial volume percentage (or atomic percentage) (for example, more than about 5 percent that has a crystalline structure (rather than the amorphous structure). The volume percentage is calculated as the total volume of the crystalline structures in metal layer 50 divided by the total volume of metal layer 50. The crystalline structures in metal layer 50 may be Hexagonal Close Packing (HCP) structures. Metal layer 50 may also be gamma-rich, which means γ-TiAl (111) rich. The volume percentage of the crystalline structures in metal layer 50 may also be more than about 80 percent, and may be in the range between about 80 percent and about 100 percent.

To increase the volume percentage of the crystalline structures in metal layer 50, during the formation of metal layer 50, the temperature of wafer 10 is increased, for example, to higher than about 200° C. The temperature may also be in the range between about 150° C. and about 450° C. If, however, metal layer 50 (which may comprise TiAl) is formed at the room temperature or slightly higher, the resulting entire metal layer 50 will have an amorphous structure. The increase in the percentage of the crystalline structures makes aluminum atoms more active, and hence results in the saturation current of the resulting MOS device 100 (FIG. 10) to be higher than if the entire metal layer 50 has an amorphous structure.

Figure 11:
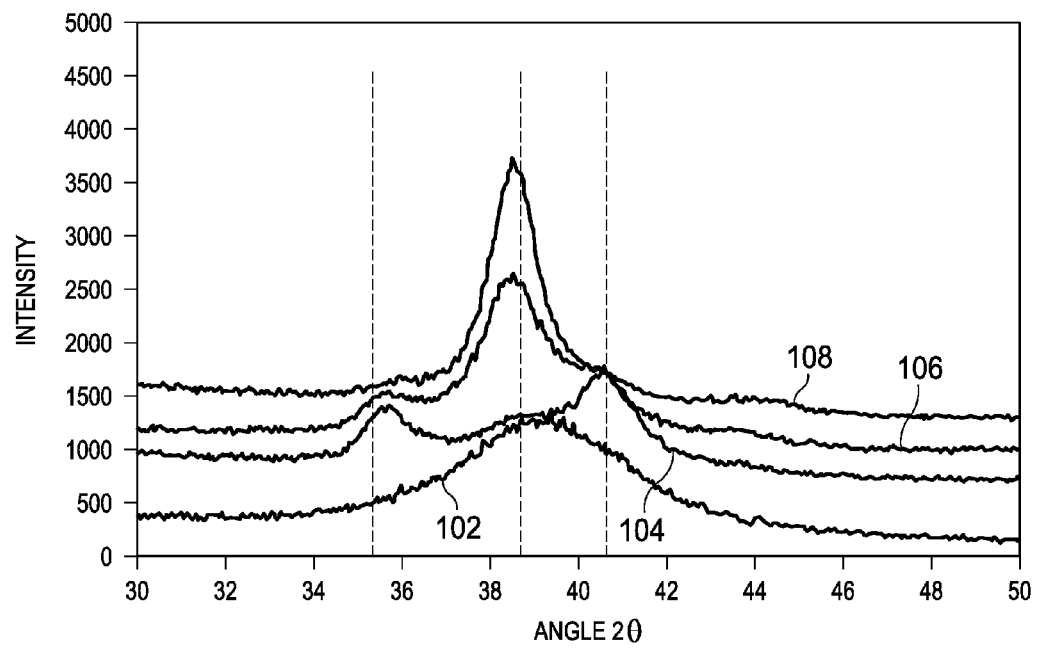
FIG. 11 illustrates a cross-sectional view of a production tool for forming a metal layer in a replacement gate of a MOS device in accordance with some embodiments.

FIG. 11 illustrates the experiment results illustrating the X-Ray Diffraction patterns of metal layer 50, wherein the X-axis is the diffraction angle, and the Y-axis is the intensity. Lines 102, 104, 106, and 108 are the patterns obtained corresponding TiAl layers formed at the room temperature, 200° C., 250° C., and 300° C., respectively. The vertical peaks occurring at the angles (2θ) equal to about 35.5 degrees, about 38.5 degrees, and about 40.5 degrees correspond to the crystalline directions (200), (111), and (201), respectively, wherein the crystalline directions are the directions that the TiAl layers are grown.

As is shown by line 102 in FIG. 11, the TiAl layer formed at the room temperature (using PVD) has no obvious peak in any crystalline direction, indicating that the respective TiAl layer is amorphous. When the deposition temperature is increased to about 200° C., there are two peaks ((200) and (201)) starting to appear, indicating the existence of the crystalline structures having the (200) and (201) direction. The respective TiAl layer has the HCP structures. When the temperature further increase to about 250° C., a significant peak of the (111) crystalline direction appears, indicating the existence of more crystalline structures having the (111) crystalline direction. The respective TiAl layer is gamma-rich. Further increasing the deposition temperature of TiAl layer 50 to about 300° C., the intensity of the peak of the (111) crystalline direction is further increased, indicating the further increase in the volume percent of the crystalline structures having the (111) crystalline direction. Therefore, FIG. 11 illustrates that with the increase in the deposition temperature of metal layer 50, a higher percentage of crystalline structure can be obtained in metal layer 50. The specific directions of the crystalline structure are related to the process conditions.

Figure 8:
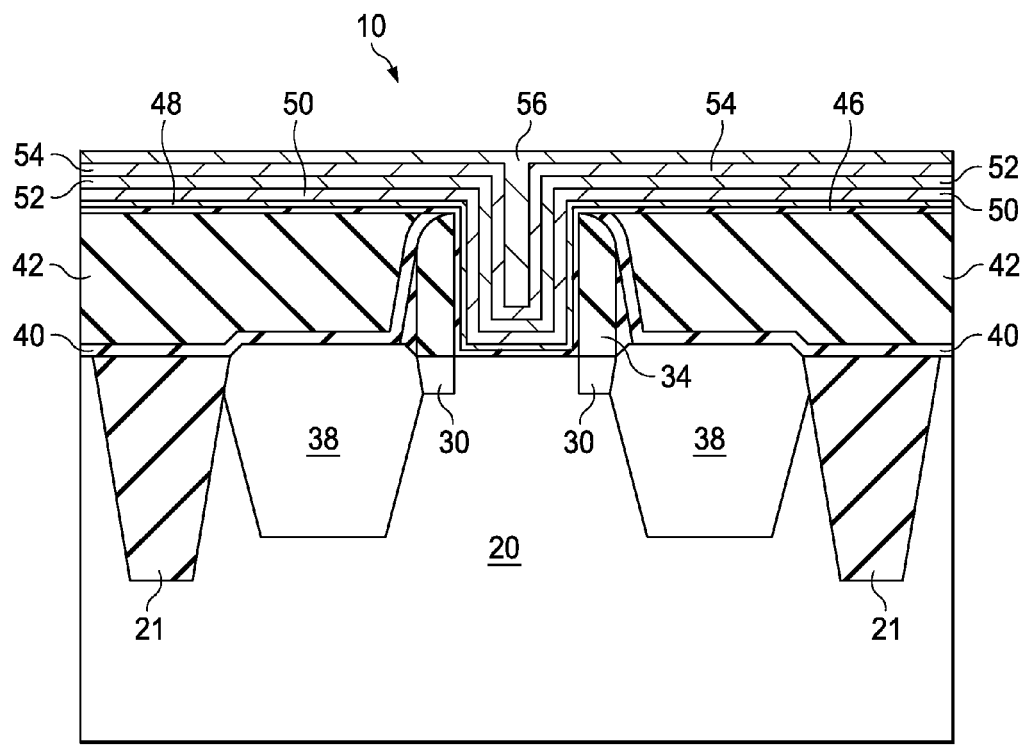

Next, more layers are formed to fill recess 44, and the resulting structure is shown in FIG. 8. In some exemplary embodiments, the subsequently formed metal layers include block layer 52, wetting layer 54, and filling metal 56. Block layer 52 may comprise TiN in some embodiments, which may be formed using PVD. Wetting layer 54 may be a cobalt layer, which may be formed using Chemical Vapor Deposition (CVD). Filling metal 56 may comprise aluminum or an aluminum alloy, which may also be formed using PVD, CVD, or the like. Filling metal 56 may be reflowed to fully fill the remaining recess 44 as in FIG. 7.

Figure 9:
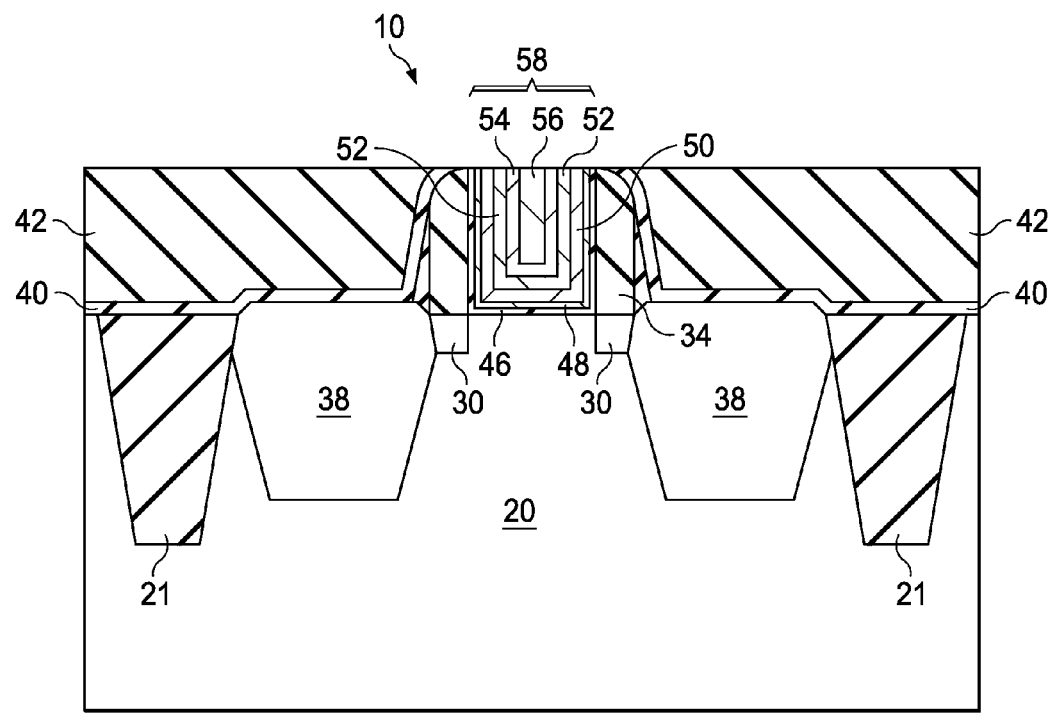

FIG. 9 illustrates a planarization step (for example, a CMP) for removing excess portions of layers 46, 48, 50, 52, 54, and 56, wherein the excess portions are over ILD 42. The remaining portions of layers 46, 48, 50, 52, 54, and 56 form replacement gate stack 58. Each of the remaining portions of layers 46, 48, 50, 52, 54, and 56 includes a bottom portion, and sidewall portions over and connected to the bottom portion.

Referring to FIG. 10, source/drain silicide regions 60 and contact plugs 62 are formed. The formation process may include forming contact plug openings in ILD 42 to expose source/drain regions 38, forming a metal layer (not shown) to extend into the contact plug openings, performing an annealing to form the source/drain silicide regions 60, removing the un-reacted portions of the metal layer, and filling the contact plug openings to form contact plugs 62. MOS device 100 is thus formed.

The embodiments of the present disclosure have some advantageous features. By increasing the temperature for forming TiAl layer in metal gates, the crystalline structures in the TiAl layer is increased, and the saturation current of the resulting MOS device increased.

In accordance with some embodiments of the present disclosure, a method includes forming a dummy gate stack over a semiconductor substrate, wherein the semiconductor substrate is comprised in a wafer. The method further includes removing the dummy gate stack to form a recess, forming a gate dielectric layer in the recess, and forming a metal layer in the recess and over the gate dielectric layer. The metal layer has an n-work function. A portion of the metal layer has a crystalline structure. The method further includes filling a remaining portion of the recess with metallic materials, wherein the metallic materials are overlying the metal layer.

In accordance with alternative embodiments of the present disclosure, a method includes forming a dummy gate stack over a semiconductor substrate, wherein the semiconductor substrate is comprised in a wafer. The method further includes removing the dummy gate stack to form a recess in an inter-layer dielectric layer, forming a gate dielectric layer in the recess, and forming a titanium aluminum layer in the recess using Physical Vapor Deposition (PVD). The titanium aluminum layer is over the gate dielectric layer. The formation of the titanium aluminum layer is performed at a temperature higher than about 200° C. The remaining portions of the recess are filled with metallic materials, wherein the metallic materials are overlying the titanium aluminum layer.

In accordance with yet alternative embodiments of the present disclosure, an integrated circuit device includes a semiconductor substrate, an ILD layer over the semiconductor substrate, gate spacers in the ILD, and a replacement gate in the ILD and between opposite portions of the gate spacers. The replacement gate includes a gate dielectric layer, a diffusion barrier layer over the gate dielectric layer, and a titanium aluminum layer over the diffusion barrier layer. The titanium aluminum layer includes portions having a crystalline structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a dummy gate stack over a semiconductor substrate, wherein the semiconductor substrate is comprised in a wafer;
   removing the dummy gate stack to form a recess;

forming a gate dielectric layer in the recess;
forming a metal layer in the recess and over the gate dielectric layer, wherein the metal layer has an n-work function, and wherein a portion of the metal layer has a crystalline structure, wherein the metal layer comprises titanium aluminum (TiAl) layer;
depositing a titanium nitride layer over the metal layer; and
filling a remaining portion of the recess with metallic materials, wherein the metallic materials are overlying the metal layer.

2. The method of claim 1, wherein the forming the metal layer comprises depositing the metal layer at a temperature higher than about 200° C.

3. The method of claim 1, wherein the forming the metal layer is performed using physical vapor deposition.

4. The method of claim 1, wherein the crystalline structure in the portion of the metal layer comprises a Hexagonal Close Packing (HCP) structure.

5. The method of claim 1, wherein the filling the remaining portion of the recess with the metallic materials comprises:
depositing a cobalt layer over the titanium nitride layer; and
depositing an aluminum layer over the cobalt layer.

6. The method of claim 1, wherein the crystalline structure has crystalline directions selected from the group consisting of a (200) direction, a (201) direction, and combinations thereof.

7. A method comprising:
forming a dummy gate stack over a semiconductor substrate, wherein the semiconductor substrate is comprised in a wafer;
removing the dummy gate stack to form a recess in an inter-layer dielectric;
forming a gate dielectric layer in the recess;
forming a titanium aluminum layer in the recess using Physical Vapor Deposition (PVD), wherein the titanium aluminum layer is over the gate dielectric layer, and wherein the forming the titanium aluminum layer is performed at a temperature higher than about 200° C.;
forming a titanium nitride layer over the titanium aluminum layer; and
filling remaining portions of the recess with metallic materials, wherein the metallic materials are overlying the titanium aluminum layer.

8. The method of claim 7, wherein the titanium aluminum layer comprises a least portions having a crystalline structure.

9. The method of claim 8, wherein the crystalline structure has crystalline directions selected from the group consisting of a (200) direction, a (111) direction, a (201) direction, and combinations thereof.

10. The method of claim 8, wherein the crystalline structure in the titanium aluminum layer has a Hexagonal Close Packing (HCP) structure.

11. The method of claim 7 further comprising:
forming a contact etch stop layer overlying the dummy gate stack;
forming the inter-layer dielectric over the contact etch stop layer; and
performing a planarization to remove excess portions of the contact etch stop layer and the inter-layer dielectric, wherein the excess portions are over the dummy gate stack.

12. The method of claim 7, wherein the filling remaining portions of the recess with the metallic materials comprises:
forming a cobalt layer over the titanium nitride layer; and
forming an aluminum layer over the cobalt layer.

13. The method of claim 7 further comprising, after the forming the gate dielectric layer and before the forming the titanium aluminum layer:
forming a titanium nitride layer over the gate dielectric layer; and
forming a tantalum nitride layer over the titanium nitride layer.

14. The method of claim 7 further comprising:
performing a planarization to remove excess portions of the metallic materials, the titanium aluminum layer, and the gate dielectric layer.

15. A method comprising:
forming a dummy gate stack and an inter-layer dielectric layer over a semiconductor substrate;
removing the dummy gate stack to form a recess in the inter-layer dielectric layer;
forming a gate dielectric layer in the recess;
forming a titanium aluminum layer extending into the recess, wherein the titanium aluminum layer is over the gate dielectric layer, and the titanium aluminum layer comprises crystalline structures with (200) or (201) direction; and
filling remaining portions of the recess with metallic materials, wherein the metallic materials are overlying the titanium aluminum layer.

16. The method of claim 15, wherein the titanium aluminum layer comprises the crystalline structures with the (200) direction.

17. The method of claim 15, wherein the titanium aluminum layer comprises the crystalline structures with the (111) direction.

18. The method of claim 15, wherein the titanium aluminum layer comprises γ-TiAl (111).

19. The method of claim 15, wherein the titanium aluminum layer is formed at a temperature higher than about 200° C.

20. The method of claim 15, wherein the titanium aluminum layer comprises the crystalline structures with the (201) direction.

* * * * *